United States Patent
Buquing

(10) Patent No.: US 8,003,432 B2
(45) Date of Patent: Aug. 23, 2011

(54) CONSUMABLE ADHESIVE LAYER FOR THIN FILM PHOTOVOLTAIC MATERIAL

(75) Inventor: Miljon T. Buquing, San Jose, CA (US)

(73) Assignee: Stion Corporation, San Jose, CA (US)

( * ) Notice: Subject to any disclaimer, the term of this patent is extended or adjusted under 35 U.S.C. 154(b) by 37 days.

(21) Appl. No.: 12/425,385

(22) Filed: Apr. 17, 2009

(65) Prior Publication Data

US 2010/0099214 A1     Apr. 22, 2010

Related U.S. Application Data

(60) Provisional application No. 61/075,731, filed on Jun. 25, 2008.

(51) Int. Cl.
*H01L 21/00* (2006.01)

(52) U.S. Cl. ................... 438/89; 257/E21.156

(58) Field of Classification Search ............ 438/69, 438/61, 85, 89, 104, 687, 660, 663; 257/614, 257/E21.158, E31.127
See application file for complete search history.

(56) References Cited

U.S. PATENT DOCUMENTS

| | | |
|---|---|---|
| 4,996,108 A | 2/1991 | Divigalpitiya et al. |
| 5,125,984 A | 6/1992 | Kruehler et al. |
| 5,261,968 A | 11/1993 | Jordan |
| 5,501,744 A | 3/1996 | Albright et al. |

(Continued)

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

(Continued)

*Primary Examiner* — Thomas L Dickey
*Assistant Examiner* — Nikolay Yushin
(74) *Attorney, Agent, or Firm* — Kilpatrick Townsend & Stockton LLP

(57) ABSTRACT

A method for forming a thin film photovoltaic device. The method includes providing a transparent substrate comprising a surface region. The method forms a first electrode layer overlying the surface region of the transparent substrate. The method also forms a thin layer of indium material, using a sputtering target of indium material, overlying the first electrode layer to act as an intermediary glue layer to facilitate attachment to the first electrode layer. In a specific embodiment, the method forms a copper material overlying the thin layer of indium material. The method also forms an indium layer overlying the copper material to form a multi layered structure including at least the thin layer of indium material, copper material, and the indium layer. In a preferred embodiment, the multi-layered structure has a first thickness. In a specific embodiment, the method also subjects at least the multi-layered structure to thermal treatment process in an environment containing a sulfur bearing species to form a copper indium disulfide alloy material while consuming substantially all of the indium layer from at least the treatment process of the multi-layered structure. In a preferred embodiment, the copper indium disulfide alloy material comprises an atomic ratio of copper indium ranging from about 1.35 to about 3.00. In a specific embodiment, the copper indium disulfide alloy material has a second thickness of more than two times of the first thickness of the multi-layered structure. The method consumes substantially all of the thin layer of indium material into a portion of the copper indium disulfide alloy material during at least the thermal treatment process. The method causes formation of a copper sulfide material overlying the copper indium disulfide alloy material during at least the thermal treatment process.

13 Claims, 10 Drawing Sheets

U.S. PATENT DOCUMENTS

| | | | |
|---|---|---|---|
| 5,536,333 | A | 7/1996 | Foote et al. |
| 5,578,503 | A * | 11/1996 | Karg et al. ............... 438/95 |
| 5,665,175 | A | 9/1997 | Safir |
| 6,307,148 | B1 * | 10/2001 | Takeuchi et al. ........... 136/264 |
| 6,328,871 | B1 | 12/2001 | Ding et al. |
| 2003/0011047 | A1 * | 1/2003 | Cunningham et al. ....... 257/614 |
| 2006/0220059 | A1 | 10/2006 | Satoh et al. |
| 2007/0089782 | A1 | 4/2007 | Scheuten et al. |
| 2007/0151596 | A1 | 7/2007 | Nasuno et al. |
| 2007/0169810 | A1 | 7/2007 | Van Duren et al. |
| 2008/0041446 | A1 | 2/2008 | Wu et al. |
| 2008/0092945 | A1 | 4/2008 | Munteanu et al. |
| 2008/0092953 | A1 | 4/2008 | Lee |

OTHER PUBLICATIONS

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

* cited by examiner

CONSUMABLE ADHESIVE LAYER FOR THIN FILM PHOTOVOLTAIC MATERIAL

CROSS-REFERENCES TO RELATED APPLICATIONS

This application claims priority to U.S. Provisional Patent Application No. 61/075,731, filed Jun. 25, 2008, entitled "CONSUMABLE ADHESIVE LAYER FOR THIN FILM PHOTOVOLTAIC MATERIAL" by inventor MILJON T. BUQUING, commonly assigned and incorporated by reference herein for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to photovoltaic materials and manufacturing method. More particularly, the present invention provides a method and structure using a consumable material facilitating adhesion between an absorber material and electrode material for manufacture of high efficiency thin film photovoltaic cells. Merely by way of example, the present method and materials include absorber materials made of copper indium disulfide species, copper tin sulfide, iron disulfide, or others for single junction cells or multi junction cells.

From the beginning of time, mankind has been challenged to find ways of harnessing energy. Energy comes in forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable source energy has been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation to electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

From the above, it is send that improved techniques for manufacturing photovoltaic materials and resulting devices are desired.

BRIEF SUMMARY OF THE INVENTION

According to embodiments of the present invention, a method and a structure for forming thin film semiconductor materials for photovoltaic applications are provided. More particularly, the present invention provides a method and structure using a consumable material facilitating adhesion between an absorber material and electrode material for manufacture of high efficiency thin film photovoltaic cells. But it would be recognized that the present invention has a much broader range of applicability, for example, embodiments of the present invention may be used to form other semiconducting thin films or multilayers comprising iron sulfide, cadmium sulfide, zinc selenide, and others, and metal oxides such as zinc oxide, iron oxide, copper oxide, and others.

In a specific embodiment, the present invention provides a method for forming a thin film photovoltaic device. The method includes providing a transparent substrate comprising a surface region. The method forms a first electrode layer overlying the surface region of the transparent substrate. The method also forms a thin layer of indium material, using a sputtering target of indium material, overlying the first electrode layer to act as an intermediary glue layer to facilitate attachment to the first electrode layer. In a specific embodiment, the method forms a copper material overlying the thin layer of indium material. The method also forms an indium layer overlying the copper material to form a multi layered structure including at least the thin layer of indium material, copper material, and the indium layer. In a preferred embodiment, the multi-layered structure has a first thickness. In a specific embodiment, the method also subjects at least the multi-layered structure to thermal treatment process in an environment containing a sulfur bearing species to form a copper indium disulfide alloy material while consuming substantially all of the indium layer from at least the treatment process of the multi-layered structure. In a preferred embodiment, the copper indium disulfide alloy material comprises an atomic ratio of copper indium ranging from about 1.35 to about 3.00. In a specific embodiment, the copper indium disulfide alloy material has a second thickness of more than two times the first thickness of the multi-layered structure. As noted, the method consumes substantially all of the thin layer of indium material into a portion of the copper indium disulfide alloy material during at least the thermal treatment process. The method causes formation of a copper sulfide material overlying the copper indium disulfide alloy material during at least the thermal treatment process. In a preferred embodiment, the method selectively removing the copper sulfide material from the copper indium disulfide alloy material and forms a window layer overlying the copper indium disulfide material.

Many benefits are achieved by way of the present invention. For example, the present invention uses starting materials that are commercially available to form a thin film of semiconductor bearing material overlying a suitable substrate member. The thin film of semiconductor bearing material can be further processed to form a semiconductor thin film material of desired characteristics, such as atomic stoichiometry, impurity concentration, carrier concentration, doping, and others. Additionally, the present method uses environmentally friendly materials that are relatively less toxic than other thin-film photovoltaic materials.

Depending on the embodiment, one or more of the benefits can be achieved. In a preferred embodiment, the present method uses a glue layer, which is consumed into the absorber material, to facilitate bonding to an electrode structure. These and other benefits will be described in more detail throughout the present specification and particularly below. Merely by way of example, the present method and materials include absorber materials made of copper indium disulfide species, copper tin sulfide, iron disulfide, or others for single junction cells or multi junction cells.

DETAILED DESCRIPTION OF THE INVENTION

According to embodiments of the present invention, a method and a structure for forming semiconductor materials for photovoltaic applications are provided. More particularly, the present invention provides a method and structure using a consumable material facilitating adhesion between an absorber material and electrode material for manufacture of high efficiency thin film photovoltaic cells. But it would be recognized that the present invention has a much broader range of applicability, for example, embodiments of the present invention may be used to form other semiconducting thin films or multilayers comprising iron sulfide, cadmium sulfide, zinc selenide, and others, and metal oxides such as zinc oxide, iron oxide, copper oxide, and others.

In a specific embodiment, a method according to an embodiment of the present invention is outlined below.

1. Start;
2. Provide a transparent substrate comprising a surface region;
3. Form a first electrode layer overlying the surface region of the transparent substrate;
4. Form a thin layer (flash) of indium material, using a sputtering target of indium material, overlying the first electrode layer, which may act as an intermediary glue layer;
5. Form a copper material overlying the thin layer of indium material;
6. Form an indium layer overlying the copper material;
7. Subject at least multi-layered structure to thermal treatment process in an environment containing a sulfur bearing species to form a copper indium disulfide allow material while consuming substantially all of the indium layer from at least the treatment process of the multi-layered structure such that the copper indium disulfide alloy material comprises an atomic ratio of copper indium ranging from about 1.35 to about 3.00 and, optionally, the copper indium disulfide alloy material has a thickness of more than 2× of the thin layer of indium overlying the copper material overlying the indium layer and an overlying layer of copper sulfide material;
8. Convert the glue layer into a portion of the copper indium disulfide alloy material during step (7);
9. Selectively removing the copper sulfide material;
10. Form a window layer overlying the copper indium disulfur material; and
11. Perform other steps, as desired.

The above sequence of steps provides a method according to an embodiment of the present invention. As shown, the method uses a combination of steps including a way of forming a copper indium disulfide or like material for photovoltaic applications according to an embodiment of the present invention. Other alternatives can also be provided where steps are added, one or more steps are removed, or one or more steps are provided in a different sequence without departing from the scope of the claims herein. Further details of the present method according to a specific embodiment can be found throughout the present specification and more particularly below.

Figure 1:
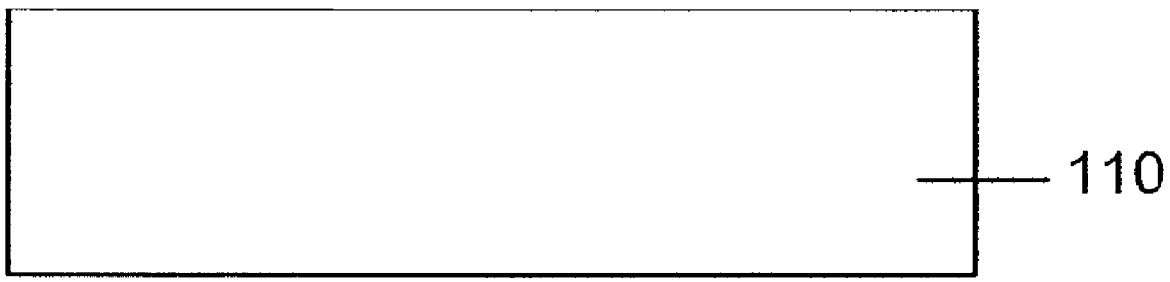
FIGS. 1-8 are schematic diagrams illustrating a method and structure for forming a thin film photovoltaic device according to an embodiment of the present invention.

FIG. 1 is a schematic diagram illustrating a process of a method for forming a thin film photovoltaic device according to an embodiment of the present invention. The diagram is merely an example, which should not unduly limit the claims herein. One skilled in the art would recognize other variations, modifications, and alternatives. As shown in FIG. 1, a substrate 110 is provided. In one embodiment, the substrate 110 includes a surface region 112 and is held in a process stage within a process chamber (not shown). In another embodiment, the substrate 110 is an optically transparent solid material. For example, the substrate 110 can be a glass, quartz, fused silica, or a plastic, or metal, or foil, or semiconductor, or other composite materials. Of course there can be other variations, modifications, and alternatives.

Figure 2:
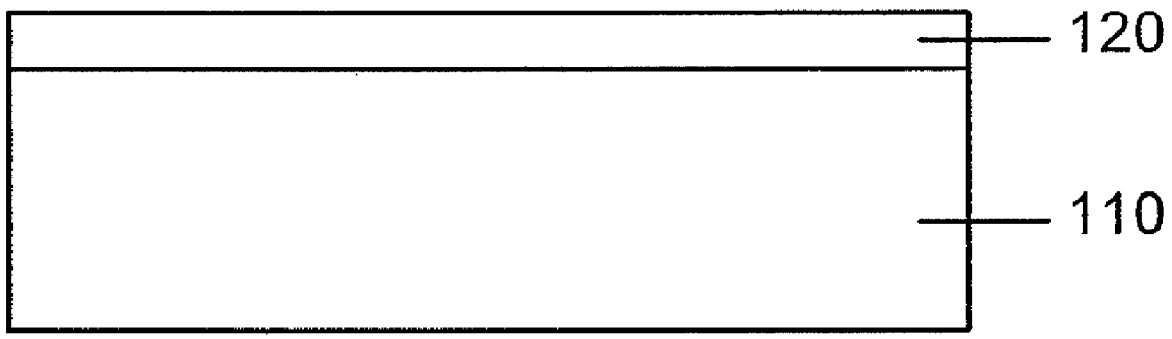

FIG. 2 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown in FIG. 2, a process for forming a thin film photovoltaic device is to form an electrode layer. In particular, an electrode layer 120 is formed overlying the surface region 112 of the substrate 110. For example, the electrode layer 120 can be made of molybdenum using sputtering, evaporation (e.g., electron beam), electro plating, combination of these, and the like according to a specific embodiment. The thickness of the electrode layer can be ranged from 100 nm to 2 micron and others, characterized by resistivity of about 100 Ohm/cm$^2$ to 10 Ohm/cm$^2$ and less according to a specific embodiment. In a preferred embodiment, the electrode is made of molybdenum or tungsten, but can be others like copper, chromium, aluminum, nickel, or platinum. Of course, there can be other variations, modifications, and alternatives.

Figure 3:
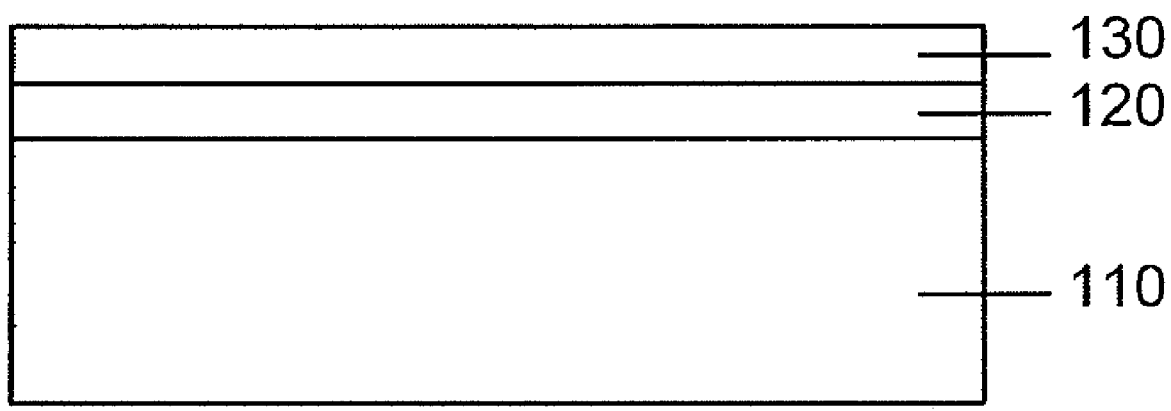

FIG. 3 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. In a specific embodiment, the method includes forming an indium layer overlying the electrode layer. The indium layer can be formed using a deposition process, such as sputtering, plating, evaporation, plasma deposition, and the like and any other suitable technique. In a specific embodiment, the layer of indium or like species, which can also be a combination of materials, is flashed using a sputtering tool. In a specific embodiment, the thin layer of indum material is at least 200 Angstroms or at least 500 Angstroms, but can be at other dimensions.

In a specific embodiment, the thin layer of indium is formed by sputtering an indium target with an argon gas. The thin layer is formed using a power of about 120 Watts DC for about ten seconds and less according to a specific embodiment. In a specific embodiment, the argon gas is provided at about a suitable flow rate. In a preferred embodiment, the process is maintained in a vacuum environment, which is about 5 millitorr and less or about 1 millitorr to about 42 millitorr. In a specific embodiment, the indum material is characterized by at least 99.99% purity that is derived from an indium target contained in a chamber, which is coupled to one or more other chambers. Additionally, the indium layer can be formed under suitable temperatures such as about 50 Degrees Celsius to about 110 Degrees Celsius according to a specific embodiment.

Referring back to FIG. 3, as shown is a process of forming a copper layer overlying the indium layer, which is overlying the electrode layer formed in last process. In particular, a copper (Cu) layer 130 is formed overlying the electrode layer 120. For example, the copper layer is formed using a sputtering process. In one example, a DC magnetron sputtering process can be used to deposit Cu layer 130 onto the electrode layer 120 under a following condition. The deposition pressure (using Ar gas) is controlled to be about 6.2 mTorr. The gas flow rate is set to about 32 sccm. The deposition temperature can be just at room temperature without need of intentionally heating the substrate. Of course, minor heating may be resulted due to the plasma generated during the deposition. Additionally, the DC power supply of about 115 W may be required. According to certain embodiments, DC power in a range from 100 W to 150 W is suitable depending specific cases with different materials. The full deposition time for a Cu layer of 330 nm thickness is about 6 minutes or more. Of course, the deposition condition can be varied and modified according to a specific embodiment.

Figure 4:
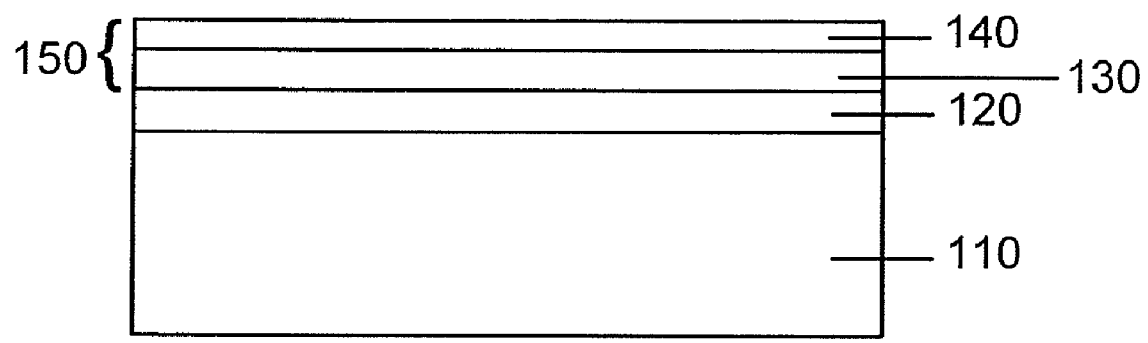

FIG. 4 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown, a process of providing an indium (In) layer overlying the copper layer is illustrated. In particular, the indium layer 140 is formed overlying the copper layer 130. For example, the indium layer is deposited over the copper layer using a sputtering process. In one example, a DC magnetron sputtering process can be used to deposit In layer 140 overlying the Cu layer 120 under a similar condition for depositing the Cu layer. The deposition time for the indium layer may be shorter than that for Cu layer. For example, 2 minutes and 45 seconds may be enough for depositing an In layer of about 410 nm in thickness. In another example, the indium layer is provided overlying the copper layer by an electro plating process, or others dependent on specific embodiment.

According to embodiments of the present invention, FIGS. 1 through 4 illustrate a formation of a multilayered structure 150 comprising copper and indium on a transparent substrate provided by processes of a method of forming a thin film photovoltaic device. In a specific embodiment, the copper layer 130 as well as the indium layer 140 are provided with an stoichiometric control to ensure that the formed multilayered structure 150 is a Cu-rich material with an atomic ratio of Cu:In greater than 1 therein. For example, the atomic ratio of Cu:In can be in a range from 1.2:1 to 2.0:1. In one implementation, the atomic ratio of Cu:In is between 1.35:1 and 1.60:1. In another implementation, the atomic ratio of Cu:In is selected to be about 1.55:1. In a specific embodiment, the formation process of indium layer 140 substantially causes no change in atomic stoichiometry in the copper layer 130 formed earlier. In another specific embodiment, the formation process of the indium layer 140 is performed earlier overlying the electrode layer 120 while the formation process of the copper layer 130 is performed later overlying the indium layer 140.

Figure 5:
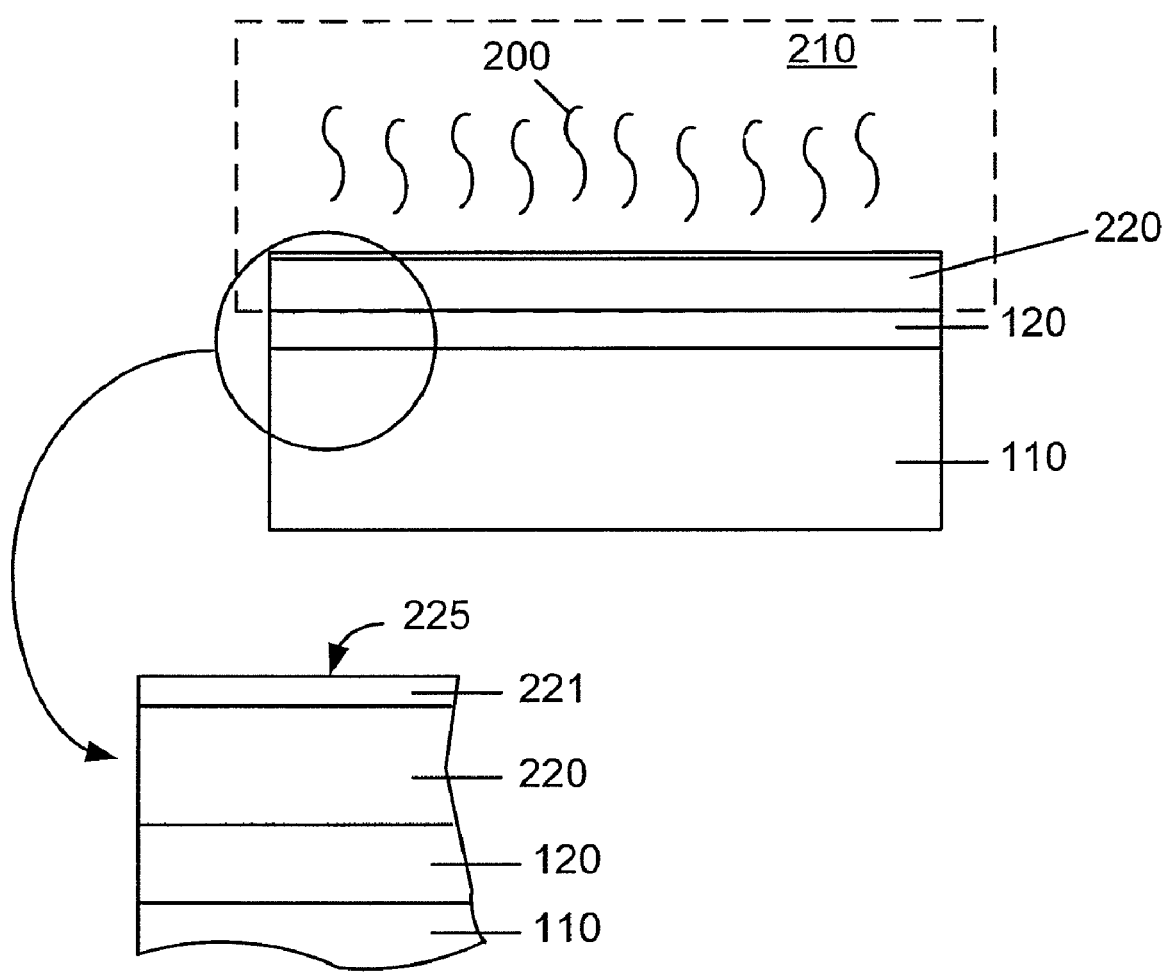

FIG. 5 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown, the formed multilayered structure 150 comprising at least an indium layer 140 over a copper layer 130 is subjected to a thermal treatment process 200 in an environment containing a sulfur bearing species 210 at an adequate pressure and at a temperature of about 400 Degrees Celsius to about 600 Degrees Celsius for about three to fifteen minutes for a rapid thermal process according to a specific embodiment. In one example, the sulfur bearing species are in a fluid phase. As an example, the sulfur can be provided in a solution, which has dissolved $Na_2S$, $CS_2$, $(NH_4)_2S$, thiosulfate, and others. In another example, the sulfur bearing species 210 are hydrogen sulfide in gas phase. In other embodiments, the sulfur can be provided in a solid phase. In a solid phase, elemental sulfur can be heated and allowed to boil, which vaporizes into a gas phase, e.g., Sn. In a specific embodiment, the gas phase is allowed to react to the indium/copper layers. In other embodiments, other combinations of sulfur species can be used. Of course, the thermal treatment process 200 includes certain predetermined ramp-up and ramp down period with certain predetermined speed for temperature changes. For example, the thermal treatment process is a rapid thermal annealing process. The hydrogen sulfide gas is provided through one or more entry valves with flow rate control into the process chamber where the hydrogen sulfide gas pressure is under controlled by one or more pumps. Of course, there can be other variations, modifications, and alternatives.

In a specific embodiment, the sulfur can be provided as a layer overlying the indium and copper layers or copper and indium layers. In a specific embodiment, the sulfur material is provided as a thin layer or patterned layer. Depending upon the embodiment, the sulfur can be provided as a slurry, powder, solid material, gas, paste, or other suitable form. Of course, there can be other variations, modifications, and alternatives.

Referring to the FIG. 5, the thermal treatment process 200 causes a reaction between copper indium material within the multilayered structure 150 and the sulfur bearing species 210, thereby forming a layer of copper indium disulfide material (or a copper indium disulfide thin film) 220. In an example, the copper indium disulfide material or copper indium disulfide thin film 220 is transformed by incorporating sulfur ions/atoms stripped or decomposed from the sulfur bearing species into the multilayered structure 150 with indium atoms and copper atoms mutually diffused therein. In a specific embodiment, the thermal treatment process 200 would result in a formation of a cap layer over the transformed copper indium disulfide material 220. The cap layer contains a thickness of substantially copper sulfide material 221 but substantially free of indium atoms. The copper sulfide material 221 includes a surface region 225 of the same copper sulfide material substantially free of indium atoms. In a specific embodiment, the formation of this cap layer is under a Cu—rich conditions for the original Cu—In bearing multilayered structure 150. Depending on the applications, the thickness of the copper sulfide material 221 is on an order of about five to ten nanometers and greater based on original multilayered structure 150 with indium layer 140 overlying copper layer 130. Of course, there can be other variations, modifications, and alternatives.

Referring again to FIG. 5, the method also subject at least multi-layered structure to thermal treatment process in an environment containing a sulfur bearing species to form a copper indium disulfide allow material while consuming substantially all of the indium layer from at least the treatment process of the multi-layered structure. As noted, the copper indium disulfide alloy material comprises an atomic ratio of copper indium ranging from about 1.35 to about 3.00 and, optionally, the copper indium disulfide alloy material has a thickness of more than 2× of the thin layer of indium overlying the copper material overlying the indium layer. As also shown is the overlying layer of copper sulfide material, which is formed once the copper indium disulfide alloy is formed. In a specific embodiment, the method further comprises converting the glue layer into a portion of the copper indium disulfide alloy material during step. In a specific embodiment, all of the glue layer is converted, while maintaining substantial attachment of an interface between the copper indium disulfide layer and underlying electrode layer. Further details of such attachment is provided throughout the present specification and more particularly below.

Figure 6:
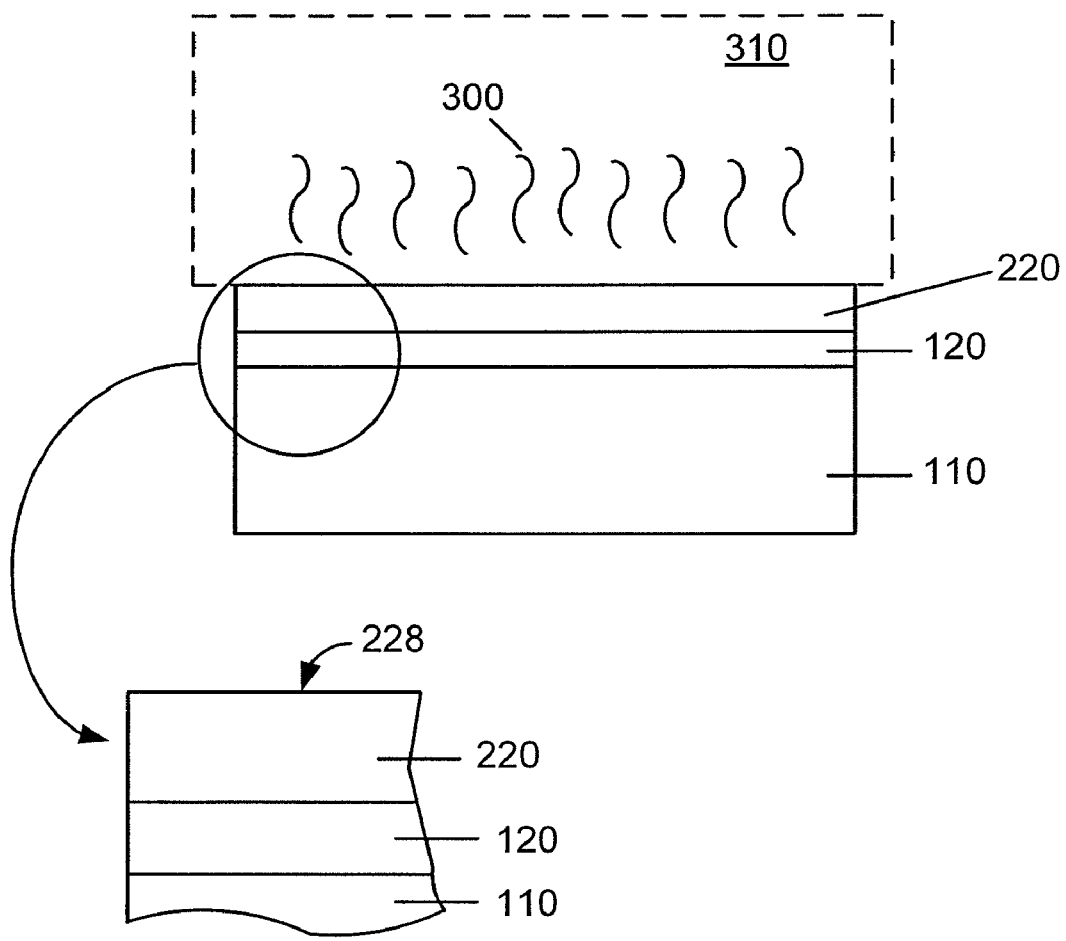

FIG. 6 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown in FIG. 6, a dip process 300 is performed to the copper sulfide material 221 that covers the copper indium disulfide thin film 220. In particular, the dip process is performed by exposing the surface region 225 to 1 to about 10 weight % solution of potassium cyanide 310 according to a specific embodiment. The potassium cyanide acts as an etchant that is capable of selectively removing copper sulfide material 221. The etching process starts from the exposed surface region 225 and down to the thickness of the copper sulfide material 221 and substantially stopped at the interface between the copper sulfide material 221 and copper indium disulfide material 220. As a result the copper sulfide cap layer 221 is selectively removed by the etching process so that a new surface region 228 of the remaining copper indium disulfide thin film 220 is exposed according to a specific embodiment. In a preferred embodiment, the etch selectivity is about 1:100 or more between copper sulfide and copper indium disulfide. In other embodiments, other selective etching species can be used. In a specific embodiment, the etching species can be hydrogen peroxide. In other embodiments, other techniques including electro-chemical etching, plasma etching, sputter-etching, or any combination of these can be used. In a specific embodiment, the copper sulfide material can be mechanically removed, chemically removed, electrically removed, or any combination of these, among others. In a specific embodiment, the absorber layer made of copper indium disulfide is about 1 to 10 microns, but can be others. Of course, there can be other variations, modifications, and alternatives.

Figure 7:
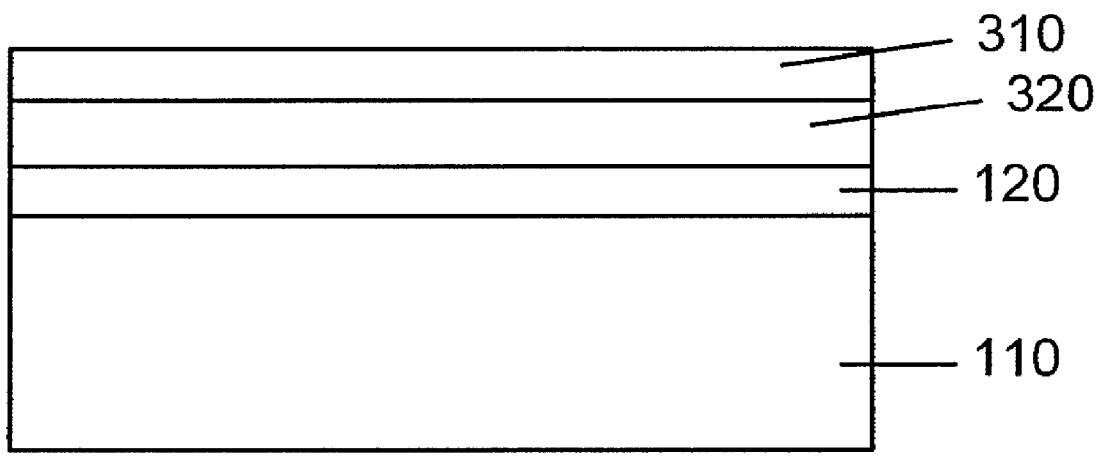

FIG. 7 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown in FIG. 7, a p-type copper indium disulfide film 320 is formed. In certain embodiments, the previously-formed copper indium disulfide material 220 has possessed a p-type semiconducting characteristic and is substantially the same as the p-type copper indium disulfide film 320. In another embodiment, the copper indium disulfide material 220 is subjected to additional doping process to adjust p-type impurity density therein for the purpose of optimizing I-V characteristic of the high efficiency thin film photovoltaic devices. In one example, aluminum species are mixed into the copper indium disulfide material 220. In another example, the copper indium disulfide material 220 is mixed with a copper indium aluminum disulfide material to form the film 320. Of course, there can be other variations, modifications, and alternatives.

Figure 8:
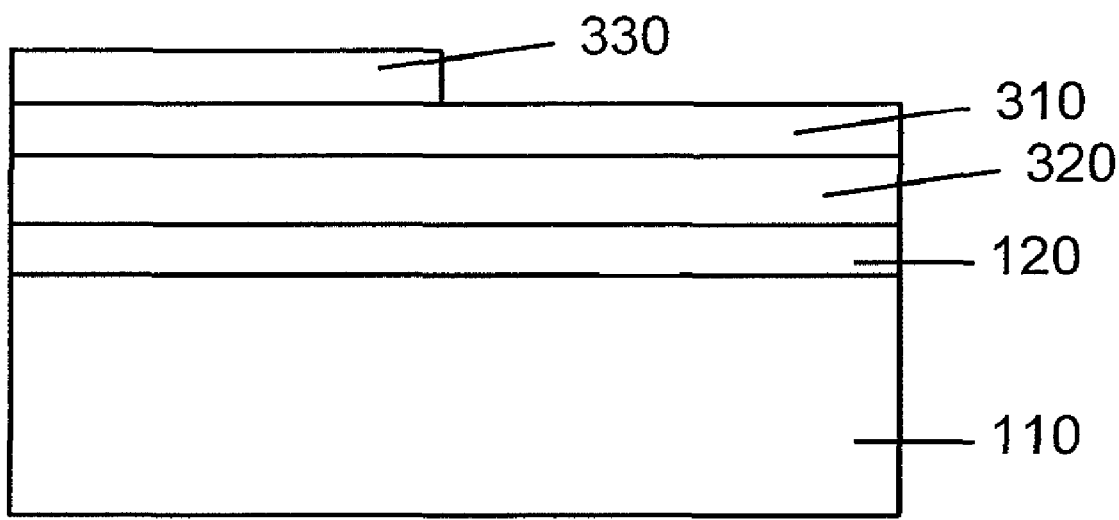

Subsequently, a window layer 310 is formed overlying the p-type copper indium disulfide material 320. The window layer 310 can be selected from a group materials consisting of a cadmium sulfide (CdS), a zinc sulfide (ZnS), zinc selinium (ZnSe), zinc oxide (ZnO), zinc magnesium oxide (ZnMgO), or others and may be doped with impurities for conductivity, e.g., $n^+$ type. The window layer 310 is intended to serve another part of a PN junction associated with a photovoltaic cell. Therefore, the window layer 310, during or after its formation, is heavily doped to form a $n^+$-type semiconductor layer. In one example, indium species are used as the doping material to cause formation of the $n^+$-type characteristic associated with the window layer 310. In another example, the doping process is performed using suitable conditions. In a specific embodiment, ZnO window layer that is doped with aluminum can range from about 200 to 500 nanometers. Of course, there can be other variations, modifications, and alternative FIG. 8 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown in FIG. 8, a conductive layer 330 is added at least partially on top of the window layer 310 to form a top electrode layer for the photovoltaic device. In one embodiment, the conductive layer 330 is a transparent conductive oxide TCO layer. For example, TCO can be selected from a group consisting of $In_2O_3$:Sn (ITO), ZnO:Al (AZO), $SnO_2$:F (TFO), and can be others. In another embodiment, the formation of the TCO layer is followed a certain predetermined pattern for effectively carried out the function of top electrode layer for the photovoltaic device with considerations of maximizing the efficiency of the thin film based photovoltaic devices. In a specific embodiment, the TCO can also act as a window layer, which essentially eliminates a separate window layer. Of course there can be other variations, modifications, and alternatives.

Figure 9:
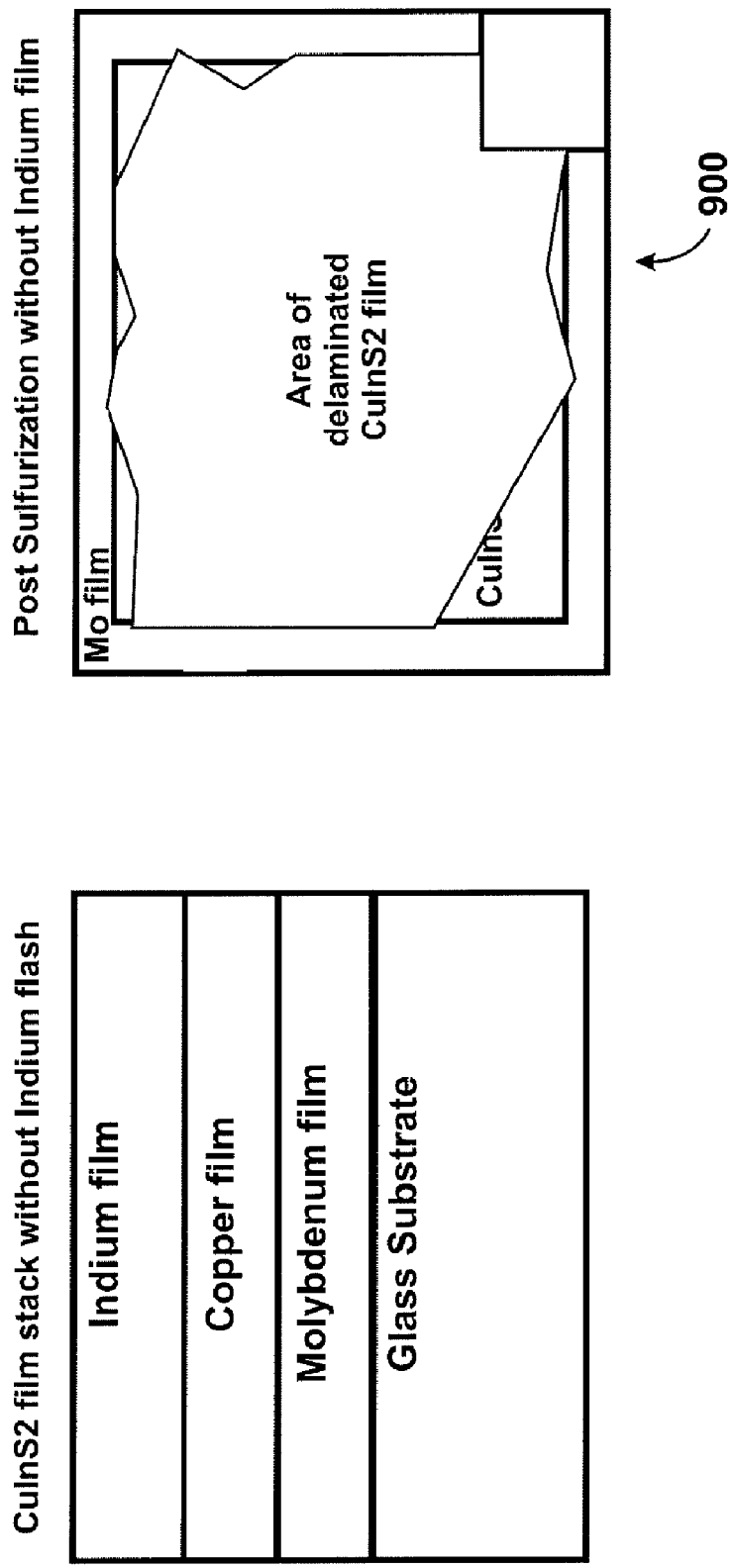
FIGS. 9 and 10 are simplified top-view diagrams of photovoltaic materials according to embodiments of the present invention.
Figure 10:
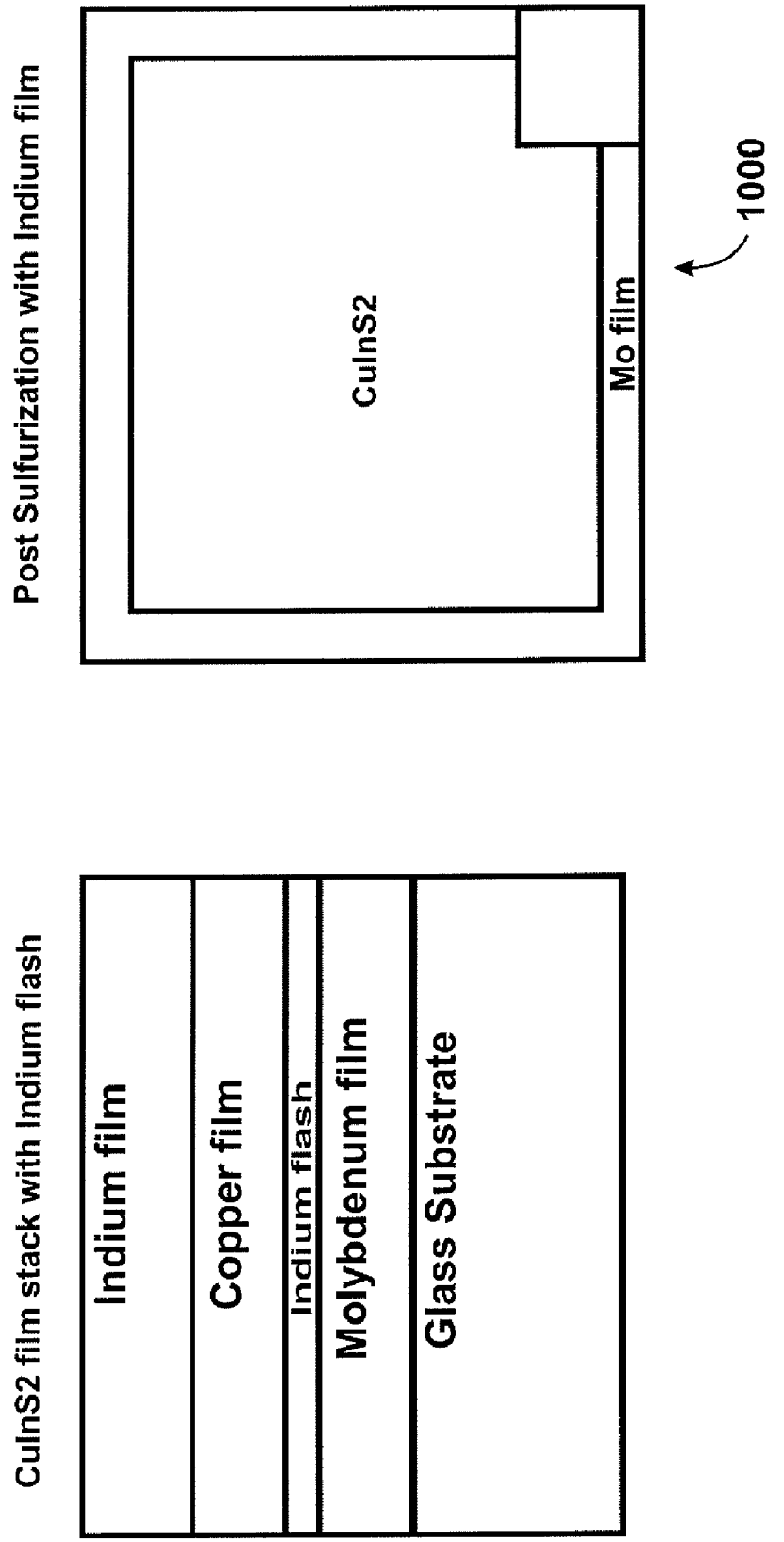

FIGS. 9 and 10 are simplified top-view diagrams of photovoltaic materials according to embodiments of the present invention. As shown, the top view diagrams illustrate a delaminated absorber layer 900 and an absorber layer that is substantially intact 1000 to the underlying electrode layer. In a specific embodiment, the absorber layer may become delaminated without the thin layer of indium material, which is consumed. I discovered the dominated film while performing experiments. Such experiments were provided to demonstrate the present invention. Certain details of the process steps are provided below, which should not unduly limit the scope of the claims herein.

| | Process Specs: |
|---|---|
| Device: | Absorber layer sputtering for Photovoltaic device. |
| Substrate materials: | sodalime glass or 1737 Corning glass |
| Sputtered films stack: | Indium flash-Cu—In |
| Sputtering Method: | Sputter-up magnetron DC sputtering. |
| Sputtering System: | Kurt J Lesker Sputtering system. |
| Material(s): | |
| Target1 Material and Purity | Cu (99.9% pure or higher) |
| Target2 Material and Purity | In (99.9% pure or higher) |
| Process gas type & purity. | Ultra High Purity Argon |
| Measurements: | |
| Cu/In ratio | 1.3 to 2.0 |
| Indium flash film thickness | 25 to 100 nm |
| Cu Film thickness | 260 to 400 nm |
| In Film thickness | 413 to 473 |
| Set-up: | |
| Process Start background pressure: | <1.6E−6 torr |
| Process chamber gas pumping | Cryo pump |
| Substrate holder | Fork-type holder, carousel-type rotation |
| System config. | multi target chamber |
| Deposition direction | Static, target facing up |
| Target power density | 1.3 to 4.0 Watt/cm$^2$ |
| Sputtering Process Conditions | Baseline Spec "with Indium flash" |
| Substrate pre-Heating Parameters | Pre-bake |
| Substrate pre-heat Temp. | 65 to 105 deg C. |
| Substrate pre-heat duration. | 10 to 15 minutes |
| Substrate pre-heat gas type | Argon |
| Substrate pre-heat gas flowrate. | 0 to 55 sccm |
| Substrate pre-heat chamber pressure. | 1.0E−7 to 0.005 torr |
| Layer1 Parameters | Indium flash Sputtering |
| DC Power | 120 Watts |
| Substrate bias | 0 Watts |
| Deposition pressure | 5 mtorr |
| Gas type | Argon |
| Total flow rate: | 45-65 sccm |
| Pressure control | Manual throttle valve with MFC feedback flow control |
| Deposition duration | 9 seconds |
| Layer2 Parameters | Copper layer Sputtering |
| DC Power | 120 Watts |
| Substrate bias | 0 Watts |
| Deposition pressure | 5 mtorr |
| Gas type | Argon |
| Total flow rate: | 45-65 sccm |
| Pressure control | Manual throttle valve with MFC feedback flow control |
| Deposition duration | 124 to 140 seconds |
| Layer3 Parameters | Indium layer Sputtering |
| DC Power | 60 to 180 Watts |
| Substrate bias | 0 to 100 Watts |
| Deposition pressure | 2 to 42 mtorr |
| Gas type | Argon |
| Total flow rate: | 10 to 150 sccm |
| Pressure control | Manual throttle valve with MFC feedback flow control |
| Deposition duration | 65 to 75 seconds |

As shown, I developed an indium layer, which is consumed to maintain an interface region between the absorber layer and the electrode substantially intact. Depending upon the specific embodiment, there can be other variations, modifications, and alternatives.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a thin film photovoltaic device, the method comprising:
   providing a transparent substrate having a surface region;
   forming a first electrode layer over the surface region of the transparent substrate;
   moving the transparent substrate from a first station to a second station, the second station including an indium target;
   using the indium target, forming a thin layer of indium material over the first electrode layer to act as an intermediary glue layer to facilitate attachment to the first electrode layer;
   forming a copper material over the thin layer of indium material;
   forming an indium layer over the copper material to provide a multi layered structure having a first thickness;
   subjecting the multi-layered structure to a thermal treatment process in an environment containing a sulfur bearing species to form a copper indium disulfide alloy material while consuming substantially all of the indium layer by the treatment process, the copper indium disulfide alloy material having an atomic ratio of copper indium ranging from about 1.35:1 to about 3:1, the copper indium disulfide alloy material having a second thickness of more than two times the first thickness;
   forming a copper sulfide material over the copper indium disulfide alloy material during the thermal treatment process;
   selectively removing the copper sulfide material from the copper indium disulfide alloy material; and
   forming a window layer overlying the copper indium disulfide material.

2. The method of claim 1 wherein the thin layer of indium material is at least 200 Angstroms thick.

3. The method of claim 1 wherein the thin layer of indium material is at least 500 Angstroms thick.

4. The method of claim 1 wherein the thin layer is formed by flash sputtering an indium target with an argon gas.

5. The method of claim 4 wherein the thin layer is formed at 120 Watts DC for less than about ten seconds.

6. The method of claim 1 further comprising maintaining a pressure of about 5 millitorr and less.

7. The method of claim 1 further comprising maintaining a pressure of about 1 millitorr to about 42 millitorr.

8. The method of claim 1 wherein the indium material is at least 99.99% purity.

9. The method of claim 1 wherein the step of forming a thin layer of indium is provided in a first station, wherein step of forming the copper material is provided in a second station, and wherein the step of forming the indium layer is provided in a third station.

10. The method of claim 1 wherein forming of the thin layer is performed at a temperature ranging from about 50 Degrees Celsius to about 110 Degrees Celsius.

11. The method of claim 1 further comprising maintaining the copper indium allow material substantially free from delaminating from the first electrode layer during the thermal treatment process.

12. The method of claim 1 wherein the thin layer of indium material is between 25 and 100 nm thick, the copper material is between 260 and 400 nm thick, and the indium layer formed over the copper material is between 413 and 473 nm thick.

13. A method for forming a thin film photovoltaic device, the method comprising:
   providing a transparent substrate having a surface region;
   forming a first electrode layer over the surface region of the transparent substrate;
   forming a thin layer of indium material over the first electrode layer to act as an intermediary glue layer to facilitate attachment to the first electrode layer;
   forming a copper material over the thin layer of indium material;
   forming an indium layer over the copper material to provide a multi layered structure having a first thickness;
   subjecting the multi-layered structure to a thermal treatment process in an environment containing a sulfur bearing species to form a copper indium disulfide alloy material while consuming substantially all of the indium layer by the treatment process, the copper indium disulfide alloy material having an atomic ratio of copper indium ranging from about 1.35:1 to about 3:1, the copper indium disulfide alloy material having a second thickness of more than two times the first thickness;
   forming a copper sulfide material over the copper indium disulfide alloy material during the thermal treatment process;
   selectively removing the copper sulfide material from the copper indium disulfide alloy material; and
   forming a window layer overlying the copper indium disulfide material; and
   wherein the step of forming a thin layer of indium is provided in a first station, the step of forming the copper material is provided in a second station, and the step of forming the indium layer is provided in a third station.

* * * * *